United States Patent
Kobayashi et al.

(10) Patent No.: US 9,076,840 B2
(45) Date of Patent: Jul. 7, 2015

(54) METHOD FOR MANUFACTURING A BONDED SOI WAFER

(71) Applicant: SHIN-ETSU HANDOTAI CO., LTD., Tokyo (JP)

(72) Inventors: Norihiro Kobayashi, Takasaki (JP); Hiroji Aga, Takasaki (JP); Isao Yokokawa, Takasaki (JP); Toru Ishizuka, Takasaki (JP); Masahiro Kato, Takasaki (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 0 days.

(21) Appl. No.: 14/364,162

(22) PCT Filed: Nov. 30, 2012

(86) PCT No.: PCT/JP2012/007690
§ 371 (c)(1),
(2) Date: Jun. 10, 2014

(87) PCT Pub. No.: WO2013/102968
PCT Pub. Date: Jul. 11, 2013

(65) Prior Publication Data
US 2014/0322895 A1   Oct. 30, 2014

(30) Foreign Application Priority Data
Jan. 6, 2012 (JP) .................................. 2012-001611

(51) Int. Cl.
*H01L 21/30* (2006.01)
*H01L 21/762* (2006.01)

(52) U.S. Cl.
CPC .............................. *H01L 21/76254* (2013.01)

(58) Field of Classification Search
None
See application file for complete search history.

(56) References Cited

U.S. PATENT DOCUMENTS

| 5,374,564 A | 12/1994 | Bruel |
| 6,362,076 B1 | 3/2002 | Inazuki et al. |

(Continued)

FOREIGN PATENT DOCUMENTS

| JP | A-5-211128 | 8/1993 |
| JP | A-11-307472 | 11/1999 |

(Continued)

OTHER PUBLICATIONS

Jan. 8, 2013 International Search Report issued in International Application No. PCT/JP2012/007690 (with translation).

(Continued)

*Primary Examiner* — Scott B Geyer
(74) *Attorney, Agent, or Firm* — Oliff PLC

(57) ABSTRACT

According to the present invention, there is provided a method for manufacturing an SOI wafer having the step of performing a first sacrificial oxidation treatment on the aforementioned bonded SOI wafer in which the delamination has been performed after a first RTA treatment has been performed thereon and then performing a second sacrificial oxidation treatment thereon after a second RTA treatment has been performed thereon, wherein the first and second RTA treatments are performed under a hydrogen gas containing atmosphere and at a temperature of 1100° C. or more, wherein after a thermal oxide film has been formed on the aforementioned SOI layer front surface by performing only thermal oxidation by a batch type heat treating furnace at a temperature of 900° C. or more and 1000° C. or less in the first and second sacrificial oxidation treatments, a treatment for removing the thermal oxide film is performed.

4 Claims, 3 Drawing Sheets

(56) References Cited

U.S. PATENT DOCUMENTS

| | | | |
|---|---|---|---|
| 6,372,609 B1 | 4/2002 | Aga et al. | |
| 7,514,341 B2 * | 4/2009 | Neyret et al. | 438/459 |
| 2003/0181001 A1 | 9/2003 | Aga et al. | |
| 2004/0115905 A1 | 6/2004 | Barge et al. | |
| 2006/0060943 A1 | 3/2006 | Ben Mohamed et al. | |
| 2006/0141755 A1 | 6/2006 | Ben Mohamed et al. | |
| 2006/0223283 A1 | 10/2006 | Maleville et al. | |
| 2008/0299376 A1 | 12/2008 | Ito et al. | |
| 2010/0120223 A1 | 5/2010 | Kobayashi et al. | |

FOREIGN PATENT DOCUMENTS

| | | |
|---|---|---|
| JP | A-2000-124092 | 4/2000 |
| JP | A-2003-510799 | 3/2003 |
| JP | A-2007-500435 | 1/2007 |
| JP | A-2008-513989 | 5/2008 |
| JP | A-2008-526010 | 7/2008 |
| JP | A-2009-32972 | 2/2009 |
| WO | WO 03/009386 A1 | 1/2003 |
| WO | WO 2007/074550 A1 | 7/2007 |
| WO | WO 2010/106101 A1 | 9/2010 |

OTHER PUBLICATIONS

International Preliminary Report on Patentability issued in International Application No. PCT/JP2012/007690 on Jul. 8, 2014 (with translation).

Feb. 17, 2015 Reason for Refusal issued in Japanese Application No. 2012-001611.

* cited by examiner

METHOD FOR MANUFACTURING A BONDED SOI WAFER

BACKGROUND OF THE INVENTION

1. Field of the Invention

The present invention relates to the method for manufacturing a bonded SOI wafer using an ion implantation delamination method, and particularly relates to a method for manufacturing the bonded SOI wafer by bonding a silicon single crystal wafer into which hydrogen ions and so forth have been implanted with a base wafer serving as a support substrate and thereafter delaminating it.

2. Description of the Related Art

Recently, as the manufacturing method for the bonded SOI wafer, a method for manufacturing the bonded SOI wafer by bonding an ion-implanted bond wafer and thereafter delaminating it (the ion implantation delamination method: a technology which is also called Smart Cut method (a registered trademark)) has started newly gaining attention.

This ion implantation delamination method is a technology that an oxide film is formed on at least one of two wafers and gas ions such as hydrogen ions, rare gas ions and so forth are implanted into an upper surface of one wafer (a bond wafer) to form an ion-implanted layer (a micro bubble layer) within the wafer, thereafter its surface into which the ions have been implanted is brought into close contact with the other wafer (a base wafer) via the oxide film (an insulator film), thereafter one wafer (the bond wafer) is delaminated so as to remain in the form of a thin film by applying a heat treatment (a delamination heat treatment) or mechanical external force using the ion-implanted layer as a cleavage plane, and a heat treatment (a bonding heat treatment) is further applied to firmly bond them to fabricate the bonded SOI wafer having a thin film (an SOI layer) on the base wafer (see Patent Literature 1). In this method, the bonded SOI wafer which is high in film thickness uniformity of the thin film, in particular, the SOI layer is easily obtained.

However, in a case where the bonded SOI wafer is fabricated by the ion implantation delamination method, a layer damaged by ion implantation exists on a front surface of the bonded SOI wafer in which the delamination has been performed and the surface roughness is increased as compared with a mirror surface of a silicon wafer of the general product level. Therefore, in the ion implantation delamination method, it becomes necessary to eliminate such damaged layer and surface roughness.

Conventionally, in a final process after a bonding heat treatment, mirror polishing (a stock removal: about 100 nm) which is called touch polishing and which is extremely reduced in stock removal has been performed in order to eliminate this damaged layer and so forth.

However, when polishing including machining factors has been performed on the SOI layer, such a problem occurs that the film thickness uniformity of the SOI layer which has been attained to some extent by implantation of hydrogen ions and so forth and delamination is deteriorated because the stock removal of polishing is not uniform.

As a method for solving such a problem, a flattening treatment in which a high-temperature heat treatment is performed in place of the touch polishing to improve the surface roughness comes to be practiced.

For example, in Patent Literature 2, it is proposed to apply a heat treatment under a hydrogen-containing reducing atmosphere (a rapid heating-rapid cooling heat treatment (RTA: Rapid Thermal Annealing)) without polishing the front surface of the SOI layer after the delamination heat treatment (or after the bonding heat treatment). In addition, in Patent Literature 3, it is proposed to form an oxide film on the SOI film by a heat treatment under an oxidizing atmosphere after the delamination heat treatment (or after the bonding heat treatment) and then remove the oxide film (a so-called sacrificial oxidation treatment) and apply the heat treatment under the reducing atmosphere (the rapid heating-rapid cooling heat treatment (the RTA treatment)).

In addition, in Patent Literature 4, flattening of a delaminating plane and avoidance of OSF generation are simultaneously attained by performing the sacrificial oxidation treatment on the SOI wafer in which the delamination has been performed after a flattening heat treatment under an atmosphere of inert gas, hydrogen gas, or mixed gas thereof.

Since the flattening treatment that the high-temperature heat treatment is performed in place of the touch polishing so as to improve the surface roughness has come to be performed as mentioned above, presently, the SOI wafers whose diameter is 300 mm and whose film thickness uniformity that a film thickness range (a value that an in-plane minimum film thickness value has been subtracted from an in-plane maximum film thickness value) of the SOI layer is within 3 nm are being obtained by the ion implantation delamination method in mass production level.

In addition, in Patent Literature 5, the content that co-implantation of ion species of at least two different atoms is performed and "RTA+StabOx (stabilized oxidation)" is performed one or a plurality of time(s) as a finishing step thereof in order to reduce the surface roughness of the delaminating plane is described (see paragraph [0046]). The content that this StabOx (the stabilized oxidation) is performed in the condition of 900° C. oxidation+1100° C. Ar annealing (two hours) is described in paragraph [0078].

Also in paragraph [0087] in Patent Literature 6, the content that "RTA+StabOx+RTA+film thinning" is performed for improvement in surface roughness of the delaminating plane caused by co-implantation of the ion species is described.

Further, although in paragraphs [0035] to [0037] in Patent Literature 7, the RTA and the sacrificial oxidation (Sox) are described as the finishing step in order to reduce defects (critical holes) in the SOI layer, only 1100 C.° is disclosed as the temperature of the SOx (the reference literature of RTA-Sox-RTA-SOx (French Patent) described in paragraph [0039] corresponds to Patent Literature 5).

Further, in Patent Literature 8, a process of delamination→ozone cleaning→hydrogen RTA (1100 to 1250° C.)→sacrificial oxidation→Ar annealing is described in order to reduce concave defects in the SOI layer (in an example, RTA (1150° C./30 sec)+Ar annealing (1200° C./1 hr)).

Patent Literature 1: Japanese Unexamined Patent Application Publication No. H5-211128
Patent Literature 2: Japanese Unexamined Patent Application Publication No. H11-307472
Patent Literature 3: Japanese Unexamined Patent Application Publication No. 2000-124092
Patent Literature 4: WO 2003/009386
Patent Literature 5: Japanese Unexamined Patent Application Publication (Translation of PCT Application) No. 2007-500435
Patent Literature 6: Japanese Unexamined Patent Application Publication (Translation of PCT Application) No. 2008-513989
Patent Literature 7: Japanese Unexamined Patent Application Publication (Translation of PCT Application) No. 2008-526010

Patent Literature 8: Japanese Unexamined Patent Application Publication No. 2009-32972

SUMMARY OF THE INVENTION

As described in Patent Literatures 5 to 8, several methods that a treatment combining the RTA with the sacrificial oxidation is performed for the purpose of improving the surface roughness of the delaminating plane and reducing the defects in the SOI layer and so forth are proposed.

However, since the sacrificial oxidation in Patent Literatures 5 and 6 is a process including a continuous and high-temperature and long-time annealing (post-annealing) after oxidation using a resistance heating type heat treating furnace (a batch furnace) as described as "900° C. oxidation+1100° C. annealing (two hours)", there was a problem that the generation frequency of slip dislocations is increased.

In addition, in Patent Literature 7, since 1100° C. is disclosed as the temperature of StabOx, there was a problem that when the sacrificial oxidation is performed at such a high temperature, OSFs (oxidation-induced stacking faults) are generated on the front surface of the SOT layer even after the RTA treatment has been performed. Further, although the method in Patent Literature 8 is effective to reduce concave defects in the SOI layer, since Ar annealing after the sacrificial oxidation is the high-temperature and long-time one, there was a problem that the generation frequency of the slip dislocations is increased similarly to the cases in Patent Literatures 5 and 6.

The present invention has been made in order to solve the abovementioned problems and an object of the present invention is to provide a method capable of suppressing generation of the slip dislocations and the defects while improving the surface roughness of the SOT layer in which the delamination has been performed and capable of manufacturing the bonded SOT wafer having the SOI layer of a desired film thickness and an excellent film thickness distribution in manufacture of the bonded SOI wafer by the ion implantation delamination method.

In order to attain the above mentioned object, the present invention provides, in a method for manufacturing a bonded SOI wafer comprising: ion-implanting gas ions of at least one kind of hydrogen ions and rare gas ions from a front surface of a bond wafer consisting of a silicon single crystal to form an ion-implanted layer within the bond wafer; bonding together the ion-implanted side front surface of the bond wafer and a front surface of a base wafer via an insulator film; and thereafter delaminating a part of the bond wafer along the aforementioned ion-implanted layer so as to have an SOI layer on the aforementioned base wafer, the method for manufacturing a bonded SOI wafer having the step of performing a first sacrificial oxidation treatment on the bonded SOI wafer in which the delamination has been performed after a first RTA treatment has been performed thereon and then performing a second sacrificial oxidation treatment thereon after a second RTA treatment has been performed thereon, wherein the first and second RTA treatments are performed under a hydrogen gas containing atmosphere and at a temperature of 1100° C. or more, wherein after a thermal oxide film has been formed on the SOI layer front surface by performing only thermal oxidation using a batch type heat treating furnace at a temperature of 900° C. or more and 1000° C. or less in the first and second sacrificial oxidation treatments, a treatment for removing the thermal oxide film is performed.

Since only thermal oxidation is performed without performing annealing under a high-temperature and long-time un-oxidizing atmosphere in the sacrificial oxidation treatment by performing the above-mentioned treatments on the bonded SOI wafer in which the delamination has been performed as mentioned above, flattening of the SOI layer and suppression of the defects can be attained and further the film thickness uniformity obtained by ion implantation delamination can be maintained. In addition, since it is not necessary to perform the high-temperature and long-time annealing, generation of the slip dislocations can be suppressed and process time reduction can be promoted. Therefore, there can be manufactured the bonded SOI wafer having the SOI layer which has the desired film thickness and is high in quality.

At that time, it is preferable to set the temperature of thermal oxidation in the first and second sacrificial oxidation treatments to 950° C. or more.

A comparatively thick oxide film can be formed in a shorter time and the productivity can be improved by performing thermal oxidation at such a temperature. In addition, since flattening and recovery of a layer damaged by ion implantation are attained by performing the RTA treatment in advance, defects such as the OSFs and so forth are not generated even at 950° C. or more.

At that time, it is preferable to delaminate the part of the aforementioned bond wafer along the aforementioned ion-implanted layer by using mechanical external force after a plasma treatment has been performed on the front surface of at least one of the aforementioned bond wafer and the aforementioned base wafer and then they have been bonded together.

The surface roughness of a delaminating plane can be reduced and the SOI layer can be more efficiently flattened by performing bond and mechanical delamination in this way.

At that time, it is preferable to perform the first and second RTA treatments at a temperature of 1230° C. or less.

Generation of the slip dislocations can be surely suppressed by performing the first and second RTA treatments as such a temperature.

As described above, according to the present invention, there can be manufactured the high-quality bonded SOI wafer having the SOI layer which is flattened and high in film thickness uniformity while suppressing generation of the slip dislocations and the defects.

DETAILED DESCRIPTION OF THE PREFERRED EMBODIMENTS

Although in the following, the present invention will be described in detail with reference to the drawings as one example of the embodiment, the present invention is not limited to this.

Figure 1:
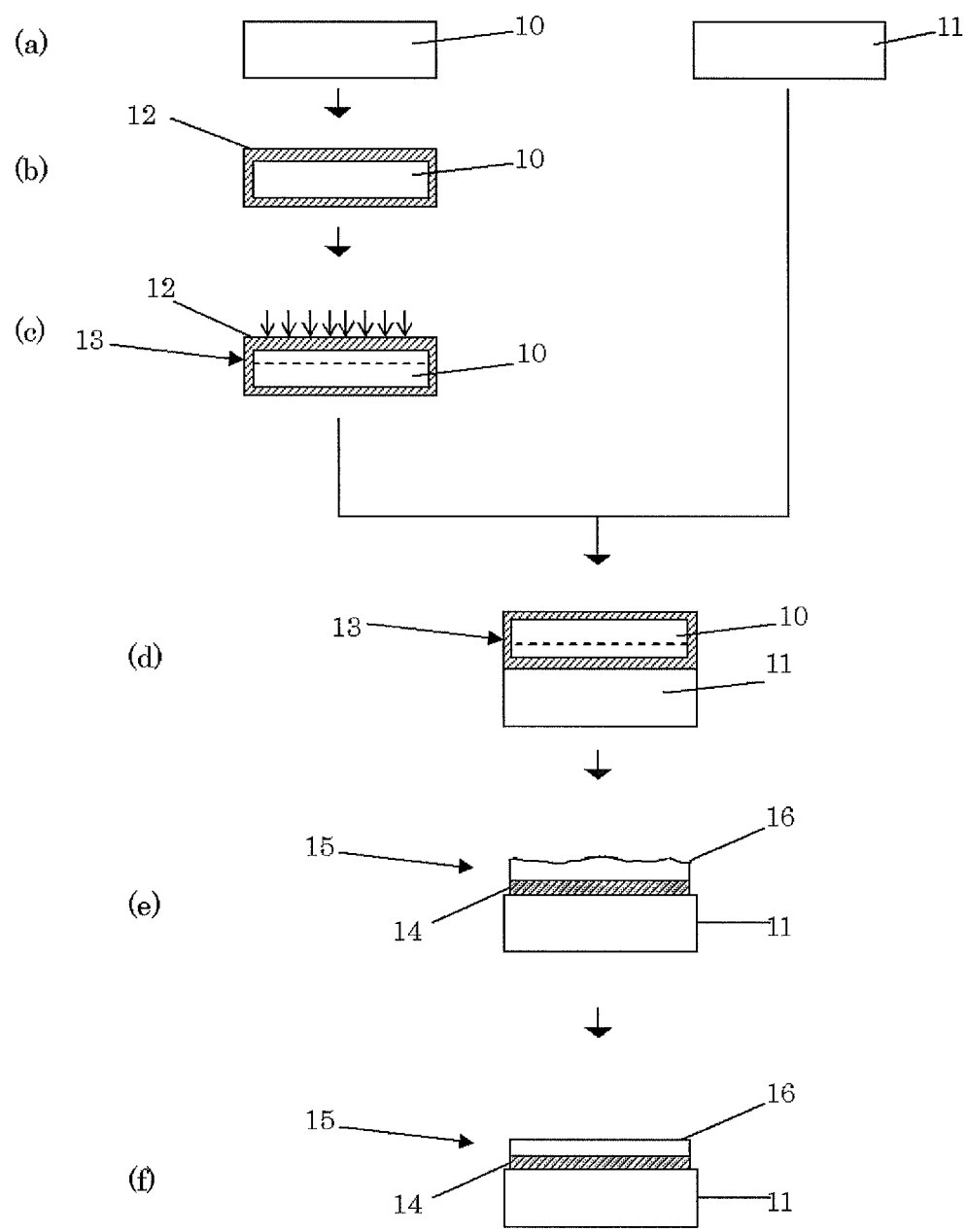
FIG. 1 is a flow chart showing one example of an embodiment of the method for manufacturing a bonded SOI wafer according to the present invention.

FIG. 1 is a flow chart of the method for manufacturing a bonded SOI wafer of the present invention.

First, in a step (a) in FIG. 1, for example, mirror-polished silicon single crystal wafers are prepared as a bond wafer 10 and a base wafer 11 serving as a support substrate.

Next, in a step (b) in FIG. 1, an oxide film 12 is formed on the bond wafer 10, for example, by thermal oxidation, CVD oxidation and so forth. The oxide film 12 may be formed on only the base wafer or on both of the wafers.

Next, in a step (c) in FIG. 1, gas ions of at least one kind of hydrogen ions and rare gas ions are implanted to form an ion-implanted layer 13 within the bond wafer 10.

Next, in a step (d) in FIG. 1, a front surface on the ion-implanted side of the bond wafer 10 and a front surface of the base wafer 11 are brought into close contact with each other and bonded together via the oxide film 12.

Incidentally, in order to remove particles and organic matters adhering to the front surfaces of the wafers, pre-bonding cleaning may be performed on both of the wafers before they are bonded together.

Next, in a step (e) in FIG. 1, the bond wafer 10 is delaminated by setting the ion-implanted layer 13 as a boundary to form a buried oxide film 14 and an SOI layer 16 on the base wafer 11, thereby obtaining a bonded SOI wafer 15.

As a delamination method, for example, a method for delaminating it by using mechanical external force without performing a heat treatment or after a heat treatment of a low temperature of such an extent that delamination would not occur has been performed is preferable. In this case, it is preferable to perform a plasma treatment on the front surface of at least one of the bond wafer 10 and the base wafer 11 before the bonding step (d) so as to increase the bonding strength of a bonding interface.

Since the surface roughness of a delaminating plane can be reduced by delaminating it with the mechanical external force in this way, not only it can be sufficiently flattened by the RTA treatment of the present invention, but also it becomes possible to relax the condition of the RTA treatment.

In addition, other than the delamination method with the mechanical external force, it is also possible to perform a heat treatment, for example, under an inert gas atmosphere and at a temperature of 500° C. or more so as to induce delamination by rearrangement of crystals and agglomeration of bubbles.

Next, in a step (f) in FIG. 1, a first sacrificial oxidation treatment is performed on the bonded SOI wafer 15 after delamination after a first RTA treatment has been performed thereon, and thereafter a second sacrificial oxidation treatment is performed thereon after a second RTA treatment has been performed thereon.

At that time, the first and second RTA treatments are performed under a hydrogen gas containing atmosphere and at a temperature of 1100° C. or more. In addition, after a thermal oxide film has been formed on the front surface of the SOI layer 16 by performing only thermal oxidation using a batch type heat treating surface at a temperature of 900° C. or more and 1000° C. or less, a treatment for removing the thermal oxide film is performed.

In a conventional sacrificial oxidation treatment, defect generation in the SOI layer has been suppressed by continuously performing 900° C. oxidation+1100° C. annealing (post annealing). However, in the present invention, since the SOI layer can be sufficiently flattened and recovery of the damaged layer can be attained by performing the RTA treatment under the hydrogen gas containing atmosphere and at the temperature of 1100° C. or more without performing the post annealing (for example, a heat treatment under a un-oxidizing atmosphere and at a temperature exceeding 1000° C.) after thermal oxidation in the sacrificial oxidation treatment (that is, only by thermal oxidation) and long-time post annealing is not needed, the rate of generation of the slip dislocations can be reduced and the time reduction of the process can be realized simultaneously. Since the sacrificial oxidation treatment can be performed after recovery of the damaged layer on the delaminating plane and flattening thereof have been performed by the RTA treatment, generation of defects upon thermal oxidation can be suppressed. Further, a flat SOI layer having a desired film thickness can be obtained while maintaining the film thickness uniformity by performing flattening and thin film processing up to the desired film thickness by the sacrificial oxidation treatment. Since recovery of the damaged layer is performed in advance by the RTA treatment, such thermal oxidation in the sacrificial oxidation treatment enables efficient formation of the thermal oxide film at the temperature of 900° C. or more and generation of the defects in the SOI layer can be surely suppressed by carrying out it at the temperature of 1000° C. or less. Flattening and damage removal of the SOI layer become sufficiently possible and it becomes possible to surely obtain the desired film thickness by performing such RTA treatment and sacrificial oxidation treatment two times.

In addition, it is preferable to set the temperature for thermal oxidation in the first and second sacrificial oxidation treatments of the present invention to 950° C. or More.

Although conventionally, there has been such a problem that when thermal oxidation is performed on the bonded SOI wafer at the temperature of 950° C. or more directly after the delamination, the defects (the OSFs) are generated on the front surface of the SOI layer, the present inventors have found that in the case of the present invention, since surface flattening and recovery of the layer damaged by ion implantation are performed by performing a high-temperature hydrogen RTA treatment before sacrificial oxidation, the OSFs are not generated even when setting the temperature for thermal oxidation to 950° C. or more (1000° C. or less). Therefore, oxidation time reduction can be realized and the productivity can be improved by performing thermal oxidation at 950° C. or more even when a comparatively thick oxide film is to be formed.

In addition, since the first and second RTA treatments of the present invention are short in time, the generation frequency of the slit dislocations is low in comparison with the heat treatment by the high-temperature and long-time batch type heat treating furnace and the flattening effect of the delaminating plane is increased by increasing the RTA treatment temperature, but it is preferable to perform the first and second RTA treatments at a temperature of 1230° C. or less since the generation frequency of the slip dislocations is increased in a treatment at a temperature exceeding 1230° C.

The first and second sacrificial oxidation treatments of the present invention can be carried out by, for example, forming the thermal oxide film on the front surface of the SOI layer by the above-mentioned thermal oxidation and removing the thermal oxide film with an HF containing solution or the like.

In addition, regarding a time for heat treatment in the first and second RTA treatments of the present invention, flattening and damage removal of the SOI layer will become possible if it is performed, for example, for one to 300 seconds.

Regarding a rapid heating-rapid cooling apparatus to be used in the first and second RTA treatments of the present invention, there is no particular limitation on it as long as it is the apparatus capable of performing the RTA treatment and, for example, a single wafer processing lamp heating apparatus can be used. In addition, the batch type heat treating furnace used in the present invention is that of the type capable of performing the heat treatment by placing the plurality of wafers in a vertical type or horizontal type heat treating furnace and, for example, resistance heating system batch type heat treating furnaces can be used. These are commercially available and are for general use.

The high-quality bonded SOI wafers which are flattened and almost free from defects can be manufactured with a high yield if it is the manufacturing method for the bonded wafer of the present invention as mentioned above.

EXAMPLES

Although the present invention will be described more specifically by showing examples and comparative examples thereof in the following, the present invention is not limited to them.

Examples 1 to 6, Comparative Examples 1 to 4

[Manufacturing Method for SOI Wafer (up to the Delamination Step): Mechanical Delamination] Examples 1 to 4, Comparative Examples 1 to 3

As the bond wafer and the base wafer, mirror-polished silicon single crystal wafers of 300 mm in diameter and <100> in crystal orientation were prepared, a thermal oxide film of 150 nm in thickness was formed on the front surface of the bond wafer, hydrogen ion implantation (dose amount: $6 \times 10^{16}/cm^2$, implantation energy: 50 keV) was performed through the thermal oxide film, a bonding plane thereof was bonded with the base wafer on which the bonding plane is activated by a plasma treatment via the oxide film at room temperature, a 350° C. and one-hour heat treatment (delamination does not occur in this heat treatment) was performed, and thereafter it was delaminated by exerting mechanical external force to the ion-implanted layer.

[Manufacturing Method for SOI Wafer (up to the Delamination Step): Delamination by Heat Treatment]

Examples 5 and 6, Comparative Example 4

As the bond wafer and the base wafers, the mirror-polished silicon single crystal wafers of 300 mm in diameter and <100> in crystal orientation were prepared, the thermal oxide film of 150 nm in thickness wad formed on the front surface of the bond wafer, hydrogen ion implantation (dose amount: $5 \times 10^{16}/cm^2$, implantation energy: 50 keV) was performed through the thermal oxide film, it was bonded with the base wafer via the oxide film at room temperature, and it was delaminated by applying a 500° C. and 0.5-hour heat treatment.

Figure 2:
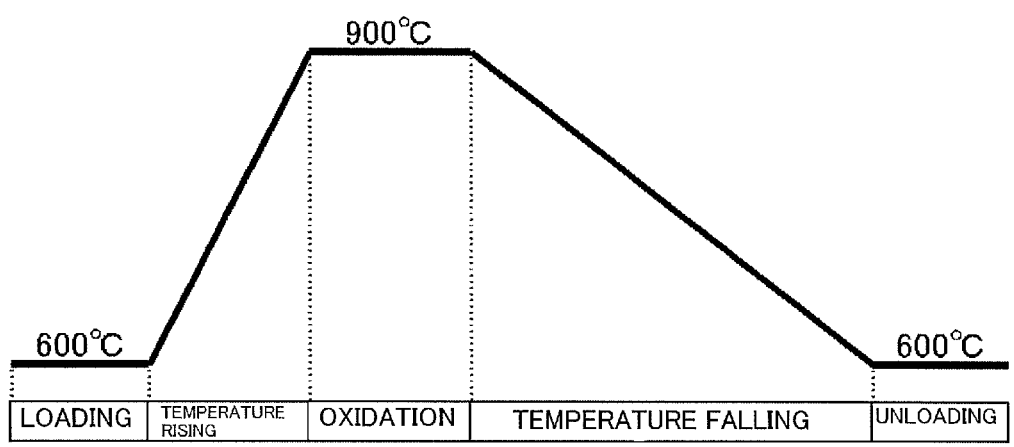
FIG. 2 is a temperature profile of thermal oxidation in a sacrificial oxidation treatment of an example 1.

In Examples 1 to 6 and Comparative Examples 1 and 2, the RTA treatment and the sacrificial oxidation treatment (thermal oxidation+thermal oxide film removal with the HF solution) were performed on the fabricated SOI wafers. Conditions are shown in Table 1. A temperature profile of thermal oxidation in the sacrificial oxidation treatment of Example 1 is shown in FIG. 2.

Figure 3:
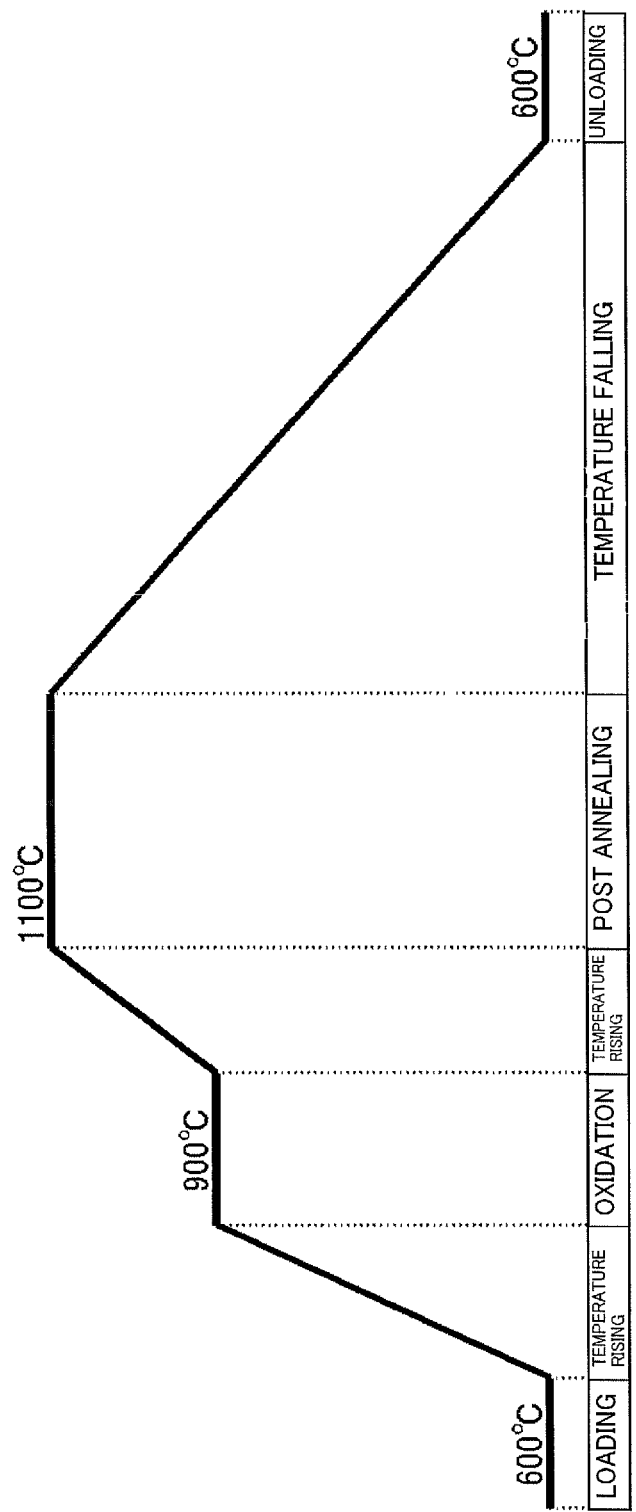
FIG. 3 is a temperature profile of thermal oxidation and post annealing in a sacrificial oxidation treatment of a comparative example 3.

In addition, in Comparative Example 3, although the RTA treatment and the sacrificial oxidation treatment (thermal oxidation+thermal oxide film removal with the HF solution) were performed on the fabricated SOI wafers, in the first and second sacrificial oxidation treatments, post annealing (100% Ar, 1100° C., two hours) was carried out continuously after termination of thermal oxidation. A temperature profile of thermal oxidation and post annealing in the sacrificial oxidation treatment of Comparative Example 3 is shown in FIG. 3.

In Comparative Example 4, Ar annealing (100% Ar, 1200° C., one hour) by the batch type heat treating furnace was carried out in place of the second RTA treatment.

[Etch Pit Measuring Method]

With respect to the manufactured SOI wafer, the SOI layer front surface was etched down to 30 nm with a chromium-less selective etchant and then the etch pit density was measured by an optical microscope.

[Slip Generation Rate]

100 SOI wafers were treated under the heat treatment condition of each of Examples and Comparative Examples and a ratio of the ones which had been decided as slip failures in comparison with a criteria sample for the slip failure was examined.

[Surface Roughness]

The front surface of the SOI layer after the second sacrificial oxidation treatment was measured by an AFM (measuring area: 30 µm-square).

A result of the above evaluations is shown in Table 1.

TABLE 1

| | | First RTA | | First Sacrificial Oxidation | | | Second RTA | |
| | | | | Film | | | | |
| | Delamination Method | Temperature (° C.) | Time (sec) | Temperature (° C.) | Thickness (nm) | Post Annealing | Temperature (° C.) | Time (sec) |
| --- | --- | --- | --- | --- | --- | --- | --- | --- |
| Example 1 | Mechanical | 1200 | 10 | 900 | 200 | None | 1200 | 10 |
| Example 2 | Mechanical | 1200 | 10 | 950 | 200 | None | 1200 | 10 |
| Example 3 | Mechanical | 1200 | 10 | 1000 | 200 | None | 1200 | 10 |
| Example 4 | Mechanical | 1100 | 30 | 950 | 200 | None | 1100 | 30 |
| Example 5 | Heat Treatment | 1200 | 10 | 950 | 200 | None | 1200 | 10 |
| Example 6 | Heat Treatment | 1225 | 10 | 950 | 200 | None | 1225 | 10 |
| Comparative Example 1 | Mechanical | 1200 | 10 | 1050 | 200 | None | 1200 | 10 |
| Comparative Example 2 | Mechanical | 1050 | 30 | 950 | 200 | None | 1050 | 30 |
| Comparative Example 3 | Mechanical | 1200 | 10 | 900 | 200 | Present | 1200 | 10 |
| Comparative Example 4 | Heat Treatment | 1200 | 10 | 950 | 200 | None | Ar 1200° C., 1 h | |

TABLE 1-continued

|  | Second Sacrificial Oxidation | | | Evaluation Result | | |
| --- | --- | --- | --- | --- | --- | --- |
|  | Temperature (° C.) | Film Thickness (nm) | Post Annealing | Etch Pit (piece/ cm$^2$) | slip Generation Rate (%) | Surface Roughness RMS (nm) |
| Example 1 | 900 | 200 | None | 20 | 4 | 0.34 |
| Example 2 | 950 | 200 | None | 70 | 4 | 0.32 |
| Example 3 | 1000 | 200 | None | 50 | 5 | 0.31 |
| Example 4 | 950 | 200 | None | 90 | 4 | 0.38 |
| Example 5 | 950 | 200 | None | 30 | 4 | 0.83 |
| Example 6 | 950 | 200 | None | 20 | 5 | 0.78 |
| Comparative Example 1 | 1050 | 200 | None | 1800 | 7 | 0.35 |
| Comparative Example 2 | 950 | 200 | None | 2000 | 4 | 0.59 |
| Comparative Example 3 | 900 | 200 | Present | 30 | 10 | 0.33 |
| Comparative Example 4 | 950 | 200 | None | 200 | 9 | 0.29 |

In Examples 1 to 6, all of the etch pit, the slip generation rate and the surface roughness exhibited favorable results. In addition, in the separately measured film thickness distribution of the SOI layer, favorable film thickness uniformity that the film thickness range (the value that the in-plane minimum film thickness value has been subtracted from the in-plane maximum film thickness value) is within 3 nm was obtained.

Incidentally, since in Examples 5 and 6, delamination by the heat treatment is performed, the surface roughness exhibited slightly large values in comparison with those of Examples 1 to 4, but they were sufficiently reduced in comparison with the surface roughness directly after the delamination and the etch pit and the slip generation rate exhibited levels equivalent to those in Examples 1 to 4.

In Comparative Example 1, since the temperature for thermal oxidation in the sacrificial oxidation treatment is a temperature exceeding 1000° C., the OSFs caused by the damages which could have not been completely removed by the RTA treatment before oxidation were generated and the defects (the etch pits) were frequently generated in the SOI layer.

In Comparative Example 2, since the temperature of the RTA treatment is less than 1100° C., removal of the damages was insufficient and thereby the OSFs were generated in thermal oxidation which is performed at 950° C., and the defects (the etch pits) were frequently generated in the SOI layer.

In Comparative Example 3, since high-temperature and long-time post annealing had been carried out continuously after termination of thermal oxidation, the slip generation rate was increased and amounted to about two times those of Examples 1 to 6.

In Comparative Example 4, since high temperature Ar annealing using the batch type heat treating furnace had been carried out in place of the second RTA treatment, the slip generation rate was increased and amounted to about two times those of Examples 1 to 6.

Incidentally, the present invention is not limited to the above-mentioned examples. The above-mentioned examples are merely illustrative and matters having configurations which are substantially identical to the technical ideas described in the scope of the patent claims of the present invention and exhibiting the same operational effects fall within the technical scope of the present invention, whatsoever they may be.

The invention claimed is:

1. A method for manufacturing a bonded SOI wafer comprising:
    ion-implanting gas ions of at least one kind of hydrogen ions and rare gas ions from a front surface of a bond wafer consisting of a silicon single crystal to form an ion-implanted layer within the bond wafer;
    bonding together the ion-implanted side front surface of the bond wafer and a front surface of a base wafer via an insulator film; thereafter
    delaminating a part of the bond wafer along the ion-implanted layer so as to have an SOI layer on the base wafer; and
    performing a first sacrificial oxidation treatment on the bonded SOI wafer in which the delamination has been performed after a first rapid thermal annealing (RTA) treatment has been performed thereon and thereafter performing a second sacrificial oxidation treatment thereon after a second RTA treatment has been performed thereon,
    wherein:
        the first and second RTA treatments are performed under a hydrogen gas containing atmosphere and at a temperature of 1100° C. or more,
        after a thermal oxide film has been formed on the SOI layer front surface by performing only thermal oxidation by a batch type heat treating furnace at a temperature of 900° C. or more and 1000° C. or less in the first and second sacrificial oxidation treatments, a treatment for removing the thermal oxide film is performed, and
        the part of the bond wafer is delaminated along the ion-implanted layer by using mechanical external force after a plasma treatment has been performed on the front surface of at least one of the bond wafer and the base wafer and then they have been bonded together via the insulator film.

2. The method for manufacturing the bonded SOI wafer according to claim 1, wherein
    the temperature for thermal oxidation in the first and second sacrificial oxidation treatments is set to 950° C. or more.

3. The method for manufacturing the bonded SOI wafer according to claim 2, wherein
    the first and second RTA treatments are performed at a temperature of 1230° C. or less.

4. The method for manufacturing the bonded SOI wafer according to claim 1, wherein
the first and second RTA treatments are performed at a temperature of 1230° C. or less.

\* \* \* \* \*